(12) United States Patent
Tabrizian et al.

(10) Patent No.: US 11,611,330 B2
(45) Date of Patent: *Mar. 21, 2023

(54) MICRO-ELECTRO-MECHANICAL RESONATORS

(71) Applicant: University of Florida Research Foundation, Inc., Gainesville, FL (US)

(72) Inventors: Roozbeh Tabrizian, Gainesville, FL (US); Mayur Ghatge, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 456 days.

This patent is subject to a terminal disclaimer.

(21) Appl. No.: 16/737,748

(22) Filed: Jan. 8, 2020

(65) Prior Publication Data

US 2020/0228095 A1    Jul. 16, 2020

Related U.S. Application Data

(60) Provisional application No. 62/792,626, filed on Jan. 15, 2019.

(51) Int. Cl.
 H01L 41/083    (2006.01)
 H01L 41/18    (2006.01)
 (Continued)

(52) U.S. Cl.
 CPC ............. *H03H 9/56* (2013.01); *H01L 41/083* (2013.01); *H01L 41/18* (2013.01); *H03H 9/17* (2013.01); *H03H 9/54* (2013.01)

(58) Field of Classification Search
 CPC . B81B 3/0021; B81C 1/00349; B81C 1/0038; H01L 41/04; H01L 41/08–0815;
 (Continued)

(56) References Cited

U.S. PATENT DOCUMENTS

| | | | | |
|---|---|---|---|---|
| 5,212,110 A | * | 5/1993 | Pfiester | H01L 21/02639 |
| | | | | 257/E21.546 |
| 2010/0327701 A1 | * | 12/2010 | Grannen | H03H 3/04 |
| | | | | 29/25.35 |

(Continued)

FOREIGN PATENT DOCUMENTS

| | | | | |
|---|---|---|---|---|
| EP | 1 187 318 | * | 3/2002 | ............... H03H 3/02 |
| WO | WO 03/058809 | * | 7/2003 | ............... H03H 9/56 |

*Primary Examiner* — Levi Gannon
(74) *Attorney, Agent, or Firm* — Alston & Bird LLP

(57) ABSTRACT

A tunable non-reciprocal frequency limiter with an asymmetric micro-electro-mechanical resonator has two independent transducer ports. One port has a film stack including a 10 nm hafnium zirconium oxide (HZO) and another port has a film stack including a 120 nm aluminum nitride (AlN) film. These film stacks are deposited on top of 70 nm single crystal silicon substrate applying CMOS compatible fabrication techniques. The asymmetric transducer architecture with dissimilar electromechanical coupling coefficients force the resonator into mechanical nonlinearity on actuation with transducer having larger coupling. A proof-of-concept electrically-coupled channel filter is demonstrated with two such asymmetric resonators at ~253 MHz with individual $Q_{res}$ of ~870 and a non-reciprocal transmission ratio (NTR) ~16 dB and $BW_{3\,dB}$ of 0.25%.

18 Claims, 6 Drawing Sheets

(51) Int. Cl.
  *H03H 9/17* (2006.01)
  *H03H 9/54* (2006.01)
  *H03H 9/56* (2006.01)

(58) Field of Classification Search
  CPC ....... H01L 41/083; H01L 41/09; H01L 41/18; H01L 41/183; H01L 41/187; H01L 41/27; H01L 41/277; H01L 41/31; H01L 41/311; H01L 41/314; H01L 41/319; H01L 41/35; H01L 41/37; H03H 9/02015; H03H 9/02244; H03H 9/02543; H03H 9/02566; H03H 9/02574; H03H 9/17; H03H 9/24–2494; H03H 9/46; H03H 9/462; H03H 9/465; H03H 9/54; H03H 9/56; H03H 2009/02251; H03H 2009/155
  See application file for complete search history.

(56) References Cited

U.S. PATENT DOCUMENTS

| | | | |
|---|---|---|---|
| 2012/0007696 A1* | 1/2012 | Pang | H03H 9/52 |
| | | | 333/189 |
| 2018/0040731 A1* | 2/2018 | Flachowsky | H01L 21/324 |
| 2021/0091742 A1* | 3/2021 | Gorisse | H03H 9/02031 |

* cited by examiner

MICRO-ELECTRO-MECHANICAL RESONATORS

CROSS-REFERENCES TO RELATED APPLICATIONS

This application claims priority to Provisional Application No. 62/792,626, filed Jan. 15, 2019, which is incorporated herein by reference in its entirety.

GOVERNMENT FUNDING

This invention was made with government support under grant number 1752206 awarded by the National Science Foundation. The government has certain rights in the invention.

TECHNICAL FIELD

The present application relates to acoustic resonators, in particular, to a piezoelectric transducer resonator system.

BACKGROUND

Ever since the advent of micro- and nano-electro-mechanical resonators, the needs for resonators having large electromechanical coupling coefficient, extreme frequency scalability, and CMOS processing compatibility have been the drivers for the advancement of thin-film piezoelectric transducers. The development of high-quality piezoelectric films has realized high-performance bulk acoustic resonators and filters, and enabled RF front-end modules for wireless mobile systems.

However, the forthcoming 5G era, with the ambitious target of the extension of wireless communication to mm-wave regime, has raised an unprecedented urgency for transformation of piezoelectric films and acoustic resonator architectures.

FULL-DUPLEX (FD) wireless communication front-ends are one of the key-enabling systems for 5G and beyond. FD communication systems can essentially double the throughput and meet the ever-demanding data requirements. However, the current FD technology faces a fundamental challenge of self-interference (SI) between the transmitter ($T_x$) and receiver ($R_x$) signals. The current linear time-invariant (LTI) systems based on conventional device architectures/materials exhibit reciprocal behavior and are inadequate to answer the SI problem. Conventionally, non-reciprocity in transmission is achieved by applying strong magnetic fields to ferromagnetic materials, use of metamaterials, time modulating input signal, among others less known. However, incompatibility with the CMOS technology, complex architecture of linear time-varying (LTV) system makes its integration into the current IC technology difficult.

Thus, CMOS compatible non-reciprocal device technology is needed to meet the future wireless communication demands.

BRIEF SUMMARY

Various embodiments encompass non-reciprocal frequency limiter architectures using micro-electro-mechanical resonators. Furthermore, the non-reciprocity in the disclosed micro-acoustic frequency limiter is reconfigurable, with respect to input power and the instantaneous control over its non-reciprocity which makes it a vital architecture for realization of FD wireless front-ends.

According to some embodiments, a two-port frequency limiter is disclosed which comprises: a first aluminum nitride (AlN) layer disposed on a substrate surface; a first molybdenum (Moly) layer disposed on the first AlN layer; a first transducer formed on the first Moly layer, wherein the first transducer comprises, a second AlN layer disposed on the first Moly layer; a second Moly layer disposed on the second AlN layer; and a second transducer formed on the second Moly layer wherein the second transducer comprises, a hafnium zirconium oxide (HZO) layer disposed on the second Moly layer; a titanium nitride (TiN) layer disposed on the HZO layer; and a first conductive layer disposed on the TiN layer; wherein the second transducer is located in the vicinity of the first transducer.

According to the disclosure, a titanium nitrite (TiN) layer is disposed between the HZO and the first conductive layer, and first conductive layer comprises one of platinum (Pt), aluminum (Al), gold (Au), and silver (Ag).

Optionally, the second conductive layer comprises one of platinum (Pt), aluminum (Al), gold (Au), and silver (Ag).

Optionally, the first AlN layer is a seed layer and the second AlN layer is a crystalline piezoelectric layer.

Optionally, the substrate surface is a crystal silicon layer.

Optionally, the second layer of AlN is a crystalline layer and has a thickness ranging from 50 nm to 200 nm.

DETAILED DESCRIPTION

Figure 1:
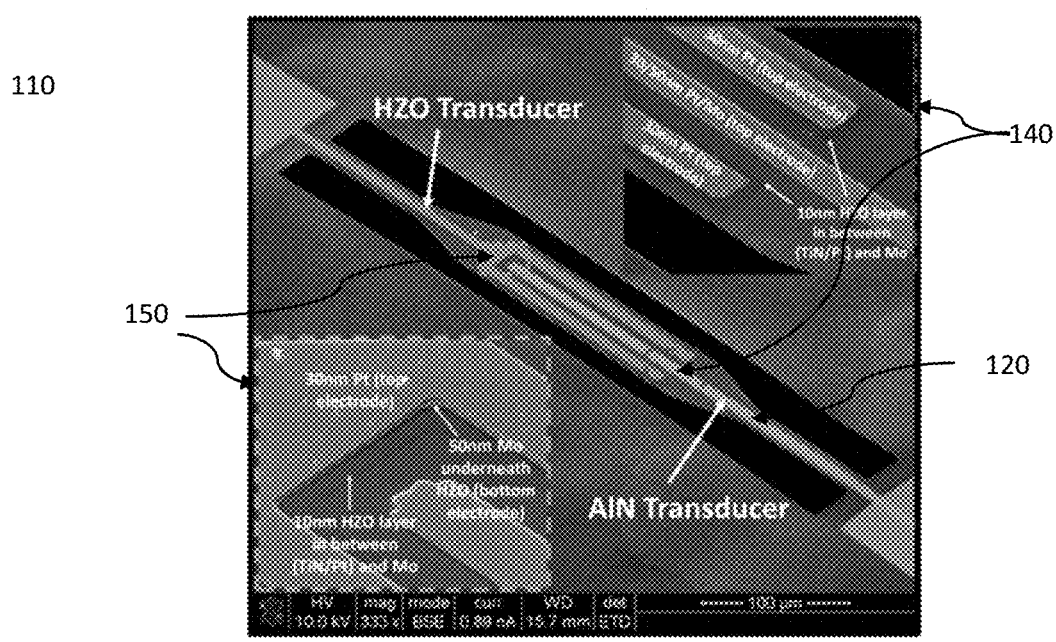
FIG. 1 shows SEM image of a two-port resonator device with the asymmetric transducer which has 10 nm HZO and 120 nm AlN, according to an embodiment of the current disclosure.

It should be understood that the examples and embodiments described herein are for illustrative purposes only and that various modifications or changes in light thereof will be suggested to persons skilled in the art and are to be included within the spirit and purview of this application.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The disclosure introduces such non-reciprocal frequency limiter architecture using micro-electro-mechanical resonators. Furthermore, the non-reciprocity in the disclosed micro-acoustic frequency limiter is reconfigurable, with respect to input power and the instantaneous control over its non-reciprocity making it a vital architecture for realization of FD wireless front-ends.

In the disclosed topology, nonlinearity induced from asymmetric electromechanical coupling of the transducers is exploited to break the time reversal symmetry and achieve $T_x$-$R_x$ non-reciprocity.

Non-Reciprocal Mems Filter Concept

The disclosed architecture of non-reciprocal frequency limiter has two resonators electrically-coupled to form a filter. The two-port resonator has its port-1 and port-2 transduced with two independent piezoelectric transducers. The individual transducers are chosen such that they have dissimilar electromechanical coupling and thus power handling capability. This enables the feasibility to drive one transducer into non-linearity while the other operates within its linear regime. Thus, an individual resonator operates as a micro-electro-mechanical diode, analogous to an electronic junction diode with energy transmitted in only one direction. Two such asymmetrically-transduced resonators are then electrically-coupled to realize a channel-select filter which can be used as a non-reciprocal frequency limiter with reconfigurable non-reciprocity.

Specifically, various embodiments are directed to a non-reciprocal frequency limiter architecture with tunable non-reciprocity. An example of such non-reciprocal frequency limiter architecture comprises two independent transducers namely, 10 nm hafnium zirconium oxide and 120 nm aluminum nitride deposited on top of 70 nm single crystal silicon substrate to design an asymmetric non-reciprocal micro-electro-mechanical resonator. Asymmetric transducer architecture with dissimilar electromechanical coupling coefficients force the resonator into mechanical nonlinearity on actuation with transducer having larger coupling. In certain embodiments, an electrically-coupled channel filter demonstrated with two such asymmetric resonators at ~253 MHz with individual $Q_{res}$ of ~870 has a non-reciprocal transmission ratio (NTR) ~16 dB and BW3 dB of 0.25%.

FIG. 1 shows a SEM image of one such two-port asymmetrically transduced resonator. 110 is Port-1, a 10 nm thick HZO transducer (transducer-1), while 120 is Port-2, an AlN transducer (transducer-2). The inserted image 140 on the upper right shows the IDT electrodes with central transducer-2 and two transducer-1 electrode stacks. The inserted image 150 at the lower left highlights the HZO transducer stack with 10 nm HZO in between the top 30 nm Pt electrode and 50 nm Mo thus making a viable transduction scheme.

Referring to the example in FIG. 1, port-1 110 comprises the stack of HZO transducer 150, made by an atomic layer deposited (ALD) 10 nm ferroelectric hafnium-zirconium oxide (HZO) transducer, while port-2 120 is a 120 nm magnetron-sputtered AlN transducer. These asymmetric transducers on top of a 70 nm Single Crystal Silicon (SCS) substrate are used to design waveguide-based resonators.

Figure 2A:
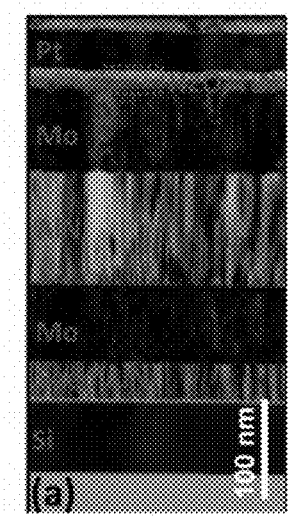
FIG. 2(a) shows a high resolution cross-sectional TEM (HR-XTEM) image of the stacked structure of the two-port resonator disclosed in FIG. 1.
Figure 2B:
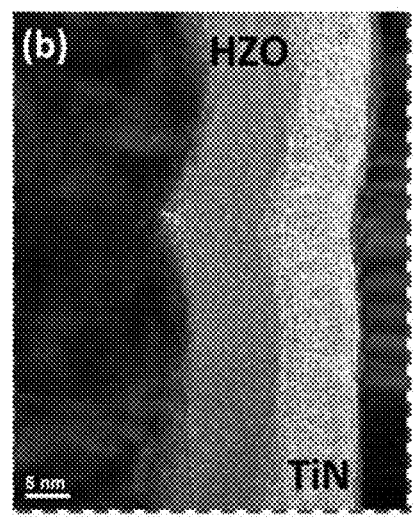
FIG. 2(b) shows a zoomed-in view of the HZO/TiN stacked layers of the XTEM in FIG. 2(a).

FIG. 2(a) illustrates the individual material layers in the resonator stack and FIG. 2(b) shows the zoomed-in view of the HZO stack critical layers. Through high resolution cross sectional TEM (HR-XTEM), the stack of Pt/HZO/TiN/Mo/AlN/Mo/Seed AlN/Si substrate is clearly demonstrated. FIG. 2(b) highlights the 10 nm HZO transducer through a zoomed-in view of the 10 nm HZO/10 nm TiN layers.

In FIG. 2(b) the crystal diffraction patters are evident in HZO indicating the crystalline form of HZO in the stack.

Figure 3:
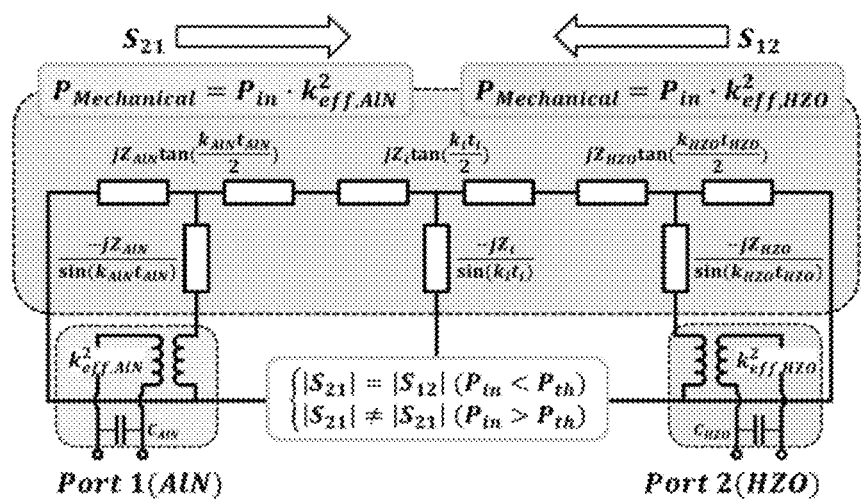
FIG. 3 illustrates the asymmetric power-handling concept using the Mason waveguide model for the resonator.

FIG. 3 illustrates the asymmetric power-handling concept using the Mason waveguide model for the resonator. $Z_{AlN/HZO}$, $k_{AlN/HZO}$, $t_{AlN/HZO}$, $C_{AlN/HZO}$ are the acoustic impedance, wavenumber, thickness and static capacitance of the individual transducer and $Z_i$, $k_i$, $t_i$, $C_i$ correspond to other non-piezoelectric materials in the resonator stack. $S_{21}$ corresponds to the power injected into the resonator when actuated using the AlN transducer operating at input power ($P_{in}$), while, $S_{12}$ corresponds to the power injected into the resonator when actuated using the HZO transducer operating at input power ($P_{in}$).

Preliminary Characterization

The nature of ferroelectric materials inherently makes them piezoelectric and this can be verified from the large span two-port frequency response of an individual resonator with AlN-drive and HZO-sense or HZO-drive and AlN-sense driving mechanism.

Figure 4:
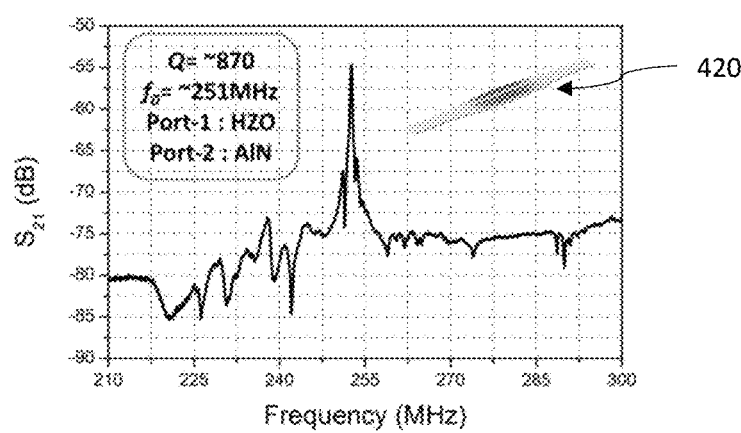
FIG. 4 illustrates the large span frequency response of an asymmetrically transduced resonator 420, according to an embodiment of the current disclosure.

FIG. 4 illustrates a large span frequency response of an asymmetrically transduced resonator in the linear regime. Port 1 has an HZO stack and Port 2 has an AlN stack. A clean spectrum without any spurious mode is achieved for the third width-extensional ($3^{rd}$ WE) waveguide-based resonator design. For the $3^{rd}$ WE mode at ~253 MHz, a very high Q factor $Q_{res}$=870 is achieved as shown in this figure. Acoustically-engineered waveguide-based resonator design as the insert 420 shows the COMSOL simulated mode shape of the 3rd width-extensional mode, resulting in a clean frequency spectrum.

Figure 5A:
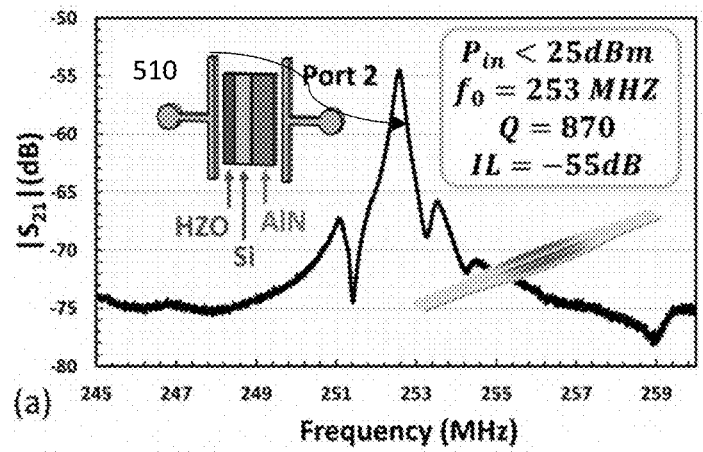
FIGS. 5a-5b show the short span frequency response for the two-port resonators with different actuation-sensing schemes.
Figure 5B:
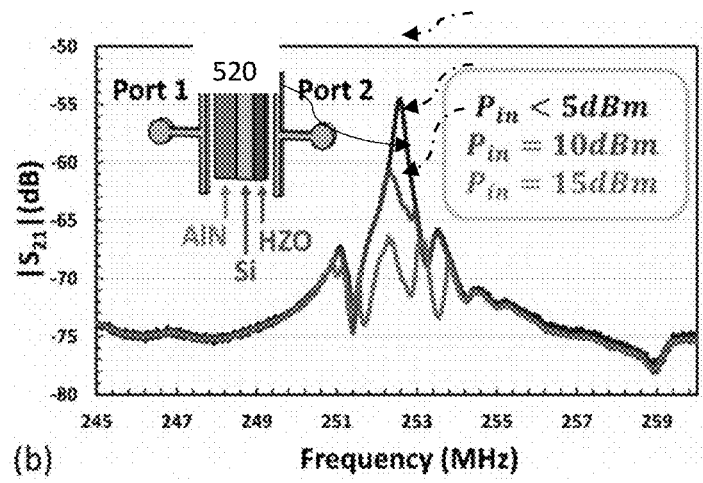

FIGS. 5(a) and 5(b) show the short-span frequency responses with varying input power $P_{in}$ for the two-port resonator in two modes. In the first mode of FIG. 5(a), Port 1 has an HZO stack and Port 2 has an AlN stack. For the HZO-drive and AlN-sense transduction scheme in 510, FIG. 5(a) demonstrates that, the short-span frequency response at different input power levels. For the AlN-drive and HZO-sense transduction scheme 520, FIG. 5(b) shows the frequency response for the same resonator.

As it can be seen clearly for the AlN-drive case in FIG. 5(b), the resonator is driven into nonlinear operation with input powers above 5 dBm, showing a highly distorted frequency response with an increased insertion loss of ~10 dB. On the other hand, when using the HZO-drive scheme in FIG. 5(a), the resonator remains in the linear regime with input powers up to 25 dBm, without showing any distortion in response.

The 120 nm thick AlN transducer drives the resonator into non-linearity (lower resonant peaks) sooner with increasing input power $P_{in}$ as the electromechanical coupling of 120 nm AlN film is significantly higher than 10 nm HZO. Higher coupling of 120 nm AlN leads the resonator into mechanical non-linearity sooner compared to 10 nm HZO. This non-reciprocal resonator phenomenon is achieved using an asymmetric transduction scheme with dissimilar electromechanical coupling coefficients of the transducers.

Unlike the elastic anharmonicity of a crystal silicon (SCS) MEMS resonator, which tends to result in resonator nonlinearity with spring-hardening or softening behavior in its frequency response, the non-linearity of an AlN-based resonator shows a distinctive behavior as demonstrated in FIG. 5(b). With the application of input power beyond the linear regime of the AlN actuated port, and further into its nonlinear regime, the frequency response gets distorted around the resonance peak instead of showing continued peak-bending phenomenon like a MEMS resonator of a crystal silicon. This is attributed to local nonlinearities in AlN that essentially distort the resonator frequency response. The low vibration amplitude of HZO transduced resonator, compared to AlN resonator, prevents it from driving the resonator into nonlinearity mechanically.

Figure 6:
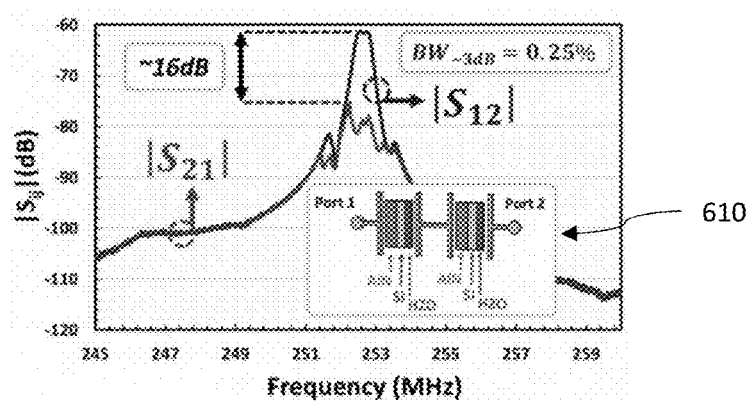
FIG. 6 demonstrates the experimental short span frequency responses of resonators disclosed in FIG. 3.

FIG. 6 demonstrates the experimental short-span frequency responses of a filter architecture 610. In FIG. 6, an electrically-coupled linear filter having HZO-drive AlN-sense has a $BW_{3\ dB}$ of 0.25%. The non-reciprocity is evident with a non-reciprocal transmission ratio (NTR) of ~16 dB.

The electrically-coupled filter demonstrating the forward (Port-1 HZO actuate and Port-2 AlN sense) and backward (Port-2 AlN actuate and Port-1 HZO sense) transmission response is disclosed. A non-reciprocal transmission ratio (i.e. difference between the insertion losses of forward and backward signal transmission) of ~16 dB is achieved. This non-reciprocity is dynamically tunable with varying the input power of the second resonator in the electrically-coupled filter architecture 610. Two coupled resonators with resonator-1 operating in the linear regime while resonator-2 dynamically reconfigured to demonstrate reciprocity/non-reciprocity as desired is the key to the non-reciprocal and reconfigurable frequency limiter/filter architecture presented herein.

The above-mentioned embodiments are only used for exemplarily describing the principle and effects of the present invention instead of limiting the present invention. One skilled in the art may make modifications or changes to the above-mentioned embodiments without departing from the spirit and scope of the present invention. Therefore, all equivalent modifications or changes made by those who have common knowledge in the art without departing from the spirit and technical thought disclosed by the present invention shall be still covered by the claims of the present invention.

The invention claimed is:

1. A two-port frequency limiter, comprising:
a substrate;
a first aluminum nitride (AlN) layer disposed on the substrate;
a first molybdenum (Mo) layer disposed on the first AlN layer;
a first transducer formed on the first Mo layer, wherein the first transducer comprises:
 a second AlN layer disposed on the first Mo layer, and
 a second Mo layer disposed on the second AlN layer; and
a second transducer formed on the second Mo layer located in a vicinity of the first transducer, wherein the second transducer comprises:
 a hafnium zirconium oxide (HZO) layer deposited on the second Mo layer,
 a titanium nitride (TiN) layer on top of the HZO layer, and
 a first conductive layer disposed on the TiN layer.

2. The two-port frequency limiter according to claim 1, wherein the HZO layer is deposited by Atomic Layer Deposition techniques.

3. The two-port frequency limiter according to claim 1, wherein the HZO layer has a thickness ranging from 5 nm to 25 nm.

4. The two-port frequency limiter according to claim 1, wherein the titanium nitrite (TiN) layer is disposed between the HZO layer and the first conductive layer.

5. The two-port frequency limiter according to claim 1, wherein the first conductive layer comprises one of platinum (Pt), aluminum (Al), gold (Au), and silver (Ag).

6. The two-port frequency limiter according to claim 1, wherein the first AlN layer is a seed layer and the second AlN layer is a crystalline layer.

7. The two-port frequency limiter according to claim 1, wherein the substrate has a crystal silicon surface.

8. The two-port frequency limiter according to claim 1, wherein the second AlN layer is a crystalline layer and has a thickness ranging from 50 nm to 200 nm.

9. A two-port frequency limiter, comprising:
a substrate;
a first transducer, wherein the first transducer comprises:
 a first conductive layer,
 a first piezoelectric layer, and
 a second conductive layer;
and
a second transducer located in a vicinity of the first transducer, wherein the second transducer comprises:
 a second piezoelectric layer disposed directly on the second conductive layer, and
 a third conductive layer disposed on the second piezoelectric layer, wherein:
the second piezoelectric layer comprises a HZO layer and a TiN layer on top of the HZO layer.

10. The two-port frequency limiter according to claim 9, wherein the first piezoelectric layer comprises one of an AlN layer, a HZO layer, a Lead Zirconate Titanate (PZT) layer, a Zinc Oxide layer (ZnO), and a Lithium Niobate (LiNbO3) layer.

11. The two-port frequency limiter according to claim 10, wherein the HZO layer in the first piezoelectric layer is formed by Atomic Layer Deposition techniques.

12. The two-port frequency limiter according to claim 11, wherein the HZO layer has a thickness ranging from 5 nm to 25 nm.

13. The two-port frequency limiter according to claim 9, wherein the HZO layer in the second piezoelectric layer is formed by Atomic Layer Deposition techniques.

14. The two-port frequency limiter according to claim 9, wherein the HZO layer has a thickness ranging from 5 nm to 25 nm.

15. The two-port frequency limiter according to claim 9, wherein the first conductive layer comprises one of Mo, platinum (Pt), aluminum (Al), gold (Au), and Silver (Ag).

16. The two-port frequency limiter according to claim 9, wherein the second conductive layer comprises one of Mo, platinum (Pt), aluminum (Al), gold (Au), and Silver (Ag).

17. The two-port frequency limiter according to claim 9, wherein the third conductive layer comprises but not limited to one of Mo, platinum (Pt), aluminum (Al), gold (Au), Silver (Ag).

18. The two-port frequency limiter according to claim 9, wherein an electromechanical coupling coefficient of the second transducer is different from an electromechanical coupling coefficient of the first transducer.

* * * * *